United States Patent [19]

Leverant

[11] Patent Number: 5,556,713
[45] Date of Patent: Sep. 17, 1996

[54] DIFFUSION BARRIER FOR PROTECTIVE COATINGS

[75] Inventor: Gerald R. Leverant, San Antonio, Tex.

[73] Assignee: Southwest Research Institute, San Antonio, Tex.

[21] Appl. No.: 417,930

[22] Filed: Apr. 6, 1995

[51] Int. Cl.$^6$ .............. B32B 15/00; B32B 15/18; C23C 14/48

[52] U.S. Cl. .............. 428/610; 428/655; 428/678; 427/528; 427/531

[58] Field of Search .............. 428/655, 678, 428/679, 680, 668, 610, 938, 629, 632, 633; 427/528, 531

[56] References Cited

U.S. PATENT DOCUMENTS

| | | |
|---|---|---|
| 3,620,693 | 11/1971 | Sama .............. 428/680 |
| 4,109,061 | 8/1978 | Beale et al. .............. 427/531 |
| 4,305,998 | 12/1981 | Manty et al. .............. 428/660 |
| 4,743,308 | 5/1988 | Sioshansi et al. .............. 427/528 |
| 4,915,746 | 4/1990 | Welsch .............. 427/528 |
| 5,316,866 | 5/1994 | Goldman et al. | |

FOREIGN PATENT DOCUMENTS 52-72336  6/1977  Japan .............. 427/528

OTHER PUBLICATIONS

Metal, Handbook, 9th Ed., vol. 5, Oct. 1982, "Ion Plating", "Ion Implantation", pp. 417–426.

A. F. Giamei, et al., Rhenium Additions to a Ni–Base Superalloy: Effects on Microstructure, Metallurgical Transactions A, vol. 16A, Nov. 1985, 1997–2005.

N. Czech, et al., Improvement of MCrAlY coatings by addition of rhenium, Elsevier Science S.A., 1994, 17–21.

H. Murakami, et al., The location of atoms in Re–and V–containing multicomponent nickel-base single-crystal superalloys, Applied Surface Science, 1994, 177–183.

D. Blavette, et al., An Atom Probe Investigation of the Role of Rhenium Additions in Improving Creep resistance of Ni–Base Superalloys, Pergamon Journals, vol. 22, 1986, 1395–1400.

L. Piechl, et al., "Overlay and Diffusion Coatings for Aero Gas Turbines," Materials for Advanced Power Engineering 1994, Oct. 1994 (pp. 717–740).

Primary Examiner—John Zimmerman
Attorney, Agent, or Firm—Rosenblatt & Redano PC

[57] ABSTRACT

The present invention provides a method for forming a diffusion barrier at one or more surfaces of a protective coating. In a preferred embodiment, the protective coating is an MCrAlY coating, and the diffusion barrier is a submicron layer of rhenium atoms. The rhenium diffusion barrier is formed by condensing vaporized rhenium onto the surface of the component and substantially simultaneously bombarding the surface with an energetic beam of inert ions. The high, localized concentration of rhenium atoms at the surface(s) of the protective coating dramatically slows the diffusion of constituent elements from the coating.

30 Claims, No Drawings

DIFFUSION BARRIER FOR PROTECTIVE COATINGS

FIELD OF THE INVENTION

The present invention relates to barriers to prevent diffusion of constituents from protective coatings for components used in high stress, high temperature applications. More particularly, the present invention relates to rhenium diffusion barriers to prevent the diffusion of components from MCrAlY protective coatings.

BACKGROUND OF THE INVENTION

Components used in high stress, high temperature applications ("high intensity" components) typically are provided with protective coatings to prevent material oxidation and hot corrosion during service. One type of protective coating for high intensity components, such as gas turbines, is an overlay coating. A popular overlay coating has a chemical composition of "MCrAlY"—where "M" is nickel, cobalt, or both, Cr is chromium, Al is aluminum, and Y is yttrium.

Certain types of components are subject to particularly high stress and high temperature conditions during use (hereinafter called "super high intensity" components). Examples of super high intensity components are jet engine parts and turbo-superchargers. In order to withstand the extreme service conditions, super high intensity components typically are made of a base material known as a "superalloy." Superalloys exhibit high temperature mechanical integrity with an unusual degree of oxidation and creep resistance. Popular protective coatings for super high intensity superalloy components are thermal barrier coatings (TBCs). TBCs maintain the temperature of the superalloy substrate at an acceptable operating level during service.

Unfortunately, protective coatings for high intensity and super high intensity components are not, themselves, immune to material degradation. One cause of material degradation in MCrAlY protective coatings is the diffusion of constituents from the coating, particularly the diffusion of aluminum. As seen from the following, the problem is most acute in thermal barrier coatings.

TBC's are multi-layered protective coatings. Basically, the innermost layer—next to the superalloy substrate—is a "bondcoat," which generally is made of MCrAlY. Just outside of the bondcoat is a middle zone, which is a very thin layer of aluminum oxide ($Al_2O_3$). The outermost layer typically is an yttria stabilized zirconia ceramic ("YSZ").

The aluminum oxide layer in a TBC tends to thicken during service. One cause of such thickening apparently is the diffusion of aluminum from the MCrAlY bondcoat to the aluminum oxide layer. As the aluminum oxide layer thickens, thermally induced cracking of the TBC occurs. The loss of aluminum from the MCrAlY bondcoat, and thickening of the aluminum oxide layer, are major causes of material degradation in TBCs. One way to reduce the loss of protectivity of such coatings is to suppress the diffusion of constituents from the coating into the substrate or—where the coating is a TBC—between the layers of the coating.

Some have attempted to improve the performance of MCrAlY coatings by adding high atomic weight elements, such as rhenium (Re), as an integral component of such coatings. Overlay coatings comprised of MCrAlY laced with rhenium are reported to have increased oxidation resistance and decreased thermal and material degradation.

Although some success has been reported when Re is used as an integral additive in MCrAlY overlay coatings, the use of Re as an additive to the coating necessarily results in random distribution of Re atoms throughout the coating. Some of the constituent aluminum atoms in the coating necessarily will diffuse past such randomly dispersed Re atoms and out of the coating.

A more effective means to suppress the diffusion of constituents from protective coatings, particularly a means to suppress the diffusion of aluminum from MCrAlY coatings, would prolong the useful lifetime of such coatings.

SUMMARY OF THE INVENTION

The present invention provides a method for forming a diffusion barrier at one or more surfaces of a protective coating. In a preferred embodiment, the protective coating is an MCrAlY coating, and the diffusion barrier is a submicron layer of rhenium atoms. The rhenium diffusion barrier is formed by condensing vaporized rhenium onto the surface of the component and substantially simultaneously bombarding the surface with an energetic beam of inert ions. The high, localized concentration of rhenium atoms at the surface(s) of the protective coating dramatically slows the diffusion of constituent elements from the coating.

DETAILED DESCRIPTION OF THE INVENTION

Substantially any high intensity superalloy component may be treated according to the present invention. Preferably, the component is comprised of a nickel- or cobalt-base superalloy. As used herein, the term "protective coating" refers to any overlay or thermal barrier coating that is used to protect high intensity components. Protective coatings suitable for treatment according to the present invention may be made using any acceptable method.

In a preferred embodiment, at least one layer of the protective coating is MCrAlY. A preferred embodiment of the invention involves forming one or more rhenium diffusion barriers: (a) between the outer surface of the superalloy component and the inner surface of the protective coating; (b) at the outer surface of the protective coating; or, (c) both.

Rhenium is the preferred material for forming the diffusion barrier of the present invention. The rhenium diffusion barrier may be formed in a number of ways as long as a sufficient amount of rhenium is adhered to the substrate or protective coating to suppress the diffusion of aluminum from the protective coating. Preferably, the method used to form the rhenium diffusion barrier should encourage some diffusion of the rhenium atoms into the near surface of the protective coating and/or the substrate. The amount of diffusion should be minimal, with the bulk of the rhenium remaining near the interface between the MCrAlY layer and adjacent layer(s).

In a preferred embodiment, the component should be cleaned using conventional procedures to remove superficial contaminants, such as grease. The component should be placed in a vacuum chamber and the pressure should be evacuated, preferably to less than about $10^{-5}$ torr. The component should be bombarded with ions, preferably argon ions, at an energy range between about 10–100 keV, preferably around 10 keV. This ion bombardment should effectively remove remaining adsorbed atoms from the surface.

Preferably, the Re should be deposited onto the component as a very thin submicron layer using electron beam physical vapor deposition (EB-PVD) and ion beam assisted deposition (IBAD). In a preferred embodiment, (a) an electron beam is used to vaporize the rhenium and the vapor is condensed onto the surface of the component to form a submicron layer of Re atoms, and (b) substantially simultaneously, a beam of inert ions, such as helium, neon, nitrogen, or argon, is directed at the surface of the component. Rhenium metal is available from a number of commercial sources, examples being Aldrich Chemical Co., Milwaukee, Wis., and Climax Molybdenum, 1370 Washington Pike, Bridgeville, Pa.

In a preferred embodiment, a beam of electrons generated by a power source of about 10 kW (1.6 amps, 10 kV) should be directed toward the rhenium source. The resulting rhenium vapor should be directed toward the surface of the component until a coating thickness of between about 10–1000 nm is achieved. A preferred coating thickness is between about 50–200 nm. The thickness of the coating may be monitored by standard methods, e.g., using the frequency change of a quartz crystal oscillator.

Substantially simultaneously, the component should be bombarded, either in a continuous or interrupted fashion, with an energetic beam of inert ions, such as helium, neon, nitrogen, and/or argon ions. The energy of bombardment should be sufficient to assist in adhering the rhenium coating to the component. The energy should range from between about 0.25 keV to about 50 keV, preferably from between about 1 keV to about 20 keV. The rate of arrival of the ions in the beam should be controlled in relation to the rate of arrival of the rhenium atoms. A preferred rate of arrival is about 1–10 ions for every 100 atoms of rhenium. The ion bombardment should be continued until the rhenium adheres strongly to the substrate.

After the rhenium is deposited onto the outer surface of the component, the component preferably should be heated to a temperature of about 1079° C. (1975° F.) for about one hour to to relieve the strain on the superalloy structure resulting from ion bombardment. Where the rhenium is deposited on the superalloy component, itself, the heating step should be followed by the formation of a protective overlay coating. In a preferred embodiment, an MCrAlY coating is deposited using any known method, preferably electron beam physical vapor deposition (EB-PVD) or low pressure plasma spray (LPPS). The MCrAlY coating is then annealed, preferably by heating to about 1079° C. (1975° F.) for about four hours in an inert atmosphere. Thereafter, the process may be repeated, if desired, to form a rhenium diffusion barrier at the outer surface of the MCrAlY coating.

The invention will be more clearly understood with reference to the following example:

EXAMPLE 1

Two turbine blades made of a nickel-base superalloy ("the components") are cleaned using conventional cleaning procedures to remove superficial contaminants, such as grease. One of the components is used as a test component and the other component is used as a control. Both components are placed in a vacuum chamber, and the pressure is evacuated to a base pressure of less than about $10^{-5}$ torr. The components are cleaned by brief bombardment with argon ions at an energy of 10 keV. Thereafter, for the test component only, a beam of electrons generated by a 10 kW power source (1.6 amps, 10 kV) is directed toward a piece of rhenium until the rhenium forms a vapor. The resulting Re vapor is directed toward the surface of the test component until a preferred coating thickness of about 100 nm is achieved. Simultaneously, both components are bombarded in a continuous fashion, with an energetic beam of argon ions, at an energy of 10 keV and a ratio of arrival of about 5 ions for every 100 atoms of rhenium condensed onto the test component.

Thereafter, both components are heated to a temperature of about 1079° C. (1975° F.) for about one hour. After cooling, both components are sent to Chromalloy Corporation, in Orangeburg, N.Y., where they are coated with an MCrAlY coating. The MCrAlY coatings are annealed by heating both the test component and the control to about 1079° C. (1975° F.) for four hours in an inert atmosphere.

In order to test the Re barrier, both components are exposed to 2100° F. (1149° C.) for 100 hours in air. Thereafter, the concentration of aluminum in the overlay coating adjacent to the superalloy substrate is measured in both components using wavelength dispersive spectroscopy. The overlay coating in the test component has a concentration of aluminum that is significantly greater than the concentration of aluminum found in the control component.

A person of ordinary skill in the art will recognize that many modifications may be made to the present invention without departing from the spirit and scope of the invention. The embodiment described herein is meant to be illustrative only and should not be taken as limiting the invention, which is defined in the following claims.

I claim:

1. A method for creating a diffusion barrier for protective coatings comprising:

placing a superalloy component having an outer surface in a vacuum chamber;

evacuating said chamber to a base pressure of about $10^{-5}$ torr or less;

condensing a submicron layer of rhenium atoms onto said outer surface of said component;

substantially simultaneously bombarding said outer surface of said component with an energetic beam of substantially inert ions at an energy of at least about 0.25 keV and a rate of arrival sufficient to adhere said rhenium to said outer surface.

2. The method of claim 1 wherein:

said energy is between about 0.25 keV to about 50 keV; and said rate of arrival is between about 1 to 10 ions per 100 of said rhenium atoms.

3. The method of claim 2 wherein said energy is between about 1 keV to about 20 keV.

4. The method of claim 1 wherein, after said rhenium atoms are deposited onto said outer surface, said component is heated for a time and at a temperature sufficient to diffuse a small amount of said rhenium atoms into said outer surface of said component.

5. The method of claim 2 wherein, after said rhenium atoms are deposited onto said outer surface, said component is heated for a time and at a temperature sufficient to diffuse a small amount of said rhenium atoms into said outer surface of said component.

6. The method of claim 3 wherein, after said rhenium atoms are deposited onto said outer surface, said component is heated for a time and at a temperature sufficient to diffuse a small amount of said rhenium atoms into said outer surface of said component.

7. The method of claim 1 wherein said superalloy is selected from the group consisting of a nickel-base and a cobalt-base superalloy.

8. The method of claim 2 wherein said superalloy is selected from the group consisting of a nickel-base and a cobalt-base superalloy.

9. The method of claim 4 wherein said superalloy is selected from the group consisting of a nickel-base and a cobalt-base superalloy.

10. The method of claim 5 wherein said superalloy is selected from the group consisting of a nickel-base and a cobalt-base superalloy.

11. The method of claim 1 wherein said outer surface comprises a protective coating.

12. The method of claim 2 wherein said outer surface comprises a protective coating.

13. The method of claim 4 wherein said outer surface comprises a protective coating.

14. The method of claim 5 wherein said outer surface comprises a protective coating.

15. The method of claim 9 wherein said outer surface comprises a protective coating.

16. The method of claim 10 wherein said outer surface comprises a protective coating.

17. The method of claim 1 further comprising the step of forming a protective coating on said rhenium barrier, said protecting coating comprising a composition having the formula MCrAlY, wherein M is selected from the group consisting of nickel, cobalt, or both, Cr is chromium, Al is aluminum, and Y is yttrium.

18. The method of claim 2 further comprising the step of forming a protective coating on said rhenium barrier, said protecting coating comprising a composition having the formula MCrAlY, wherein M is selected from the group consisting of nickel, cobalt, or both, Cr is chromium, Al is aluminum, and Y is yttrium.

19. The method of claim 5 further comprising the step of forming a protective coating on said rhenium barrier, said protective coating comprising a composition having the formula MCrAlY, wherein M is selected from the group consisting of nickel, cobalt, or both, Cr is chromium, Al is aluminum, and Y is yttrium.

20. The method of claim 10 further comprising the step of forming a protective coating on said rhenium barrier, said protective coating comprising a composition having the formula MCrAlY, wherein M is selected from the group consisting of nickel, cobalt, or both, Cr is chromium, Al is aluminum, and Y is yttrium.

21. A method for creating a rhenium diffusion barrier for a protective coating comprising a composition having the formula MCrAlY, wherein M is selected from the group consisting of nickel, cobalt, or both, Cr is chromium, Al is aluminum, and Y is yttrium, comprising the steps of:

placing a superalloy component having an outer surface in a vacuum chamber;

evacuating said chamber to a base pressure of about $10^{-5}$ torr;

condensing a submicron layer of rhenium atoms onto said outer surface of said component;

substantially simultaneously bombarding said outer surface of said component with an energetic beam of substantially inert ions at an energy between about 0.25 keV to about 50 keV and a rate of arrival of about 1–10 ions per 100 rhenium atoms, whereby said rhenium adheres to said outer surface by ion beam assisted deposition.

22. The method of claim 21 wherein said outer surface comprises a protective coating.

23. The method of claim 21 wherein, after said rhenium atoms are deposited onto said outer surface, said component is heated for a time and at a temperature sufficient to diffuse a small amount of said rhenium atoms into said outer surface of said component.

24. The method of claim 22 wherein, after said rhenium atoms are deposited onto said outer surface, said component is heated for a time and at a temperature sufficient to diffuse a small amount of said rhenium atoms into said outer surface of said component.

25. A superalloy component for high stress, high temperature applications having improved resistance to material degradation, comprising:

a superalloy component with a diffusion barrier at an outer surface, said diffusion barrier comprising a mixture of atoms of said superalloy and rhenium; and, an overlay coating over said diffusion barrier.

26. The component of claim 25 wherein said superalloy is selected from the group consisting of a nickel-base superalloy and a cobalt-base superalloy.

27. The component of claim 25 wherein said overlay coating is a composition comprising the formula MCrAlY, wherein M is selected from the group consisting of nickel, cobalt, or both, Cr is chromium, Al is aluminum, and Y is yttrium.

28. The component of claim 26 wherein said overlay coating is a composition comprising the formula MCrAlY, wherein M is selected from the group consisting of nickel, cobalt, or both, Cr is chromium, Al is aluminum, and Y is yttrium.

29. The component of claim 25 wherein said overlay coating has an outer surface comprising a diffusion barrier comprising a mixture of atoms of said overlay coating and rhenium.

30. A superalloy component for high stress, high temperature applications having improved resistance to material degradation, comprising:

a superalloy component; and, a protective coating on said superalloy component, said protective coating having an outer surface comprising a diffusion barrier comprising a mixture of atoms of said protective coating and rhenium.

* * * * *